US012783930B2

(12) United States Patent
Takeuchi et al.

(10) Patent No.: US 12,783,930 B2
(45) Date of Patent: Nov. 3, 2026

(54) QUBIT CONTROL CIRCUIT

(71) Applicant: National University Corporation YOKOHAMA National University, Yokohama (JP)

(72) Inventors: Naoki Takeuchi, Yokohama (JP); Nobuyuki Yoshikawa, Yokohama (JP)

(73) Assignee: National University Corporation YOKOHAMA National University, Yokohama (JP)

( * ) Notice: Subject to any disclaimer, the term of this patent is extended or adjusted under 35 U.S.C. 154(b) by 215 days.

(21) Appl. No.: 18/842,709

(22) PCT Filed: Feb. 27, 2023

(86) PCT No.: PCT/JP2023/007010
§ 371 (c)(1),
(2) Date: Aug. 29, 2024

(87) PCT Pub. No.: WO2023/167129
PCT Pub. Date: Sep. 7, 2023

(65) Prior Publication Data

US 2026/0244965 A1 Aug. 20, 2026

(30) Foreign Application Priority Data

Mar. 3, 2022 (JP) ................................ 2022-032905

(51) Int. Cl.
*G06N 10/40* (2022.01)
*H03K 17/92* (2006.01)
*H03K 19/195* (2006.01)

(52) U.S. Cl.
CPC ............ *G06N 10/40* (2022.01); *H03K 17/92* (2013.01); *H03K 19/195* (2013.01)

(58) Field of Classification Search
CPC ....... G06N 10/40; H03K 17/92; H03K 19/195
USPC ..................................... 326/4; 327/367, 528
See application file for complete search history.

(56) References Cited

U.S. PATENT DOCUMENTS 4,623,804 A 11/1986 Goto
4,947,118 A 8/1990 Fujimaki
(Continued)

FOREIGN PATENT DOCUMENTS

JP S58-075246 A 5/1983
JP 59-143427 A 8/1984
(Continued)

OTHER PUBLICATIONS

International Search Report for International Patent Application No. PCT/JP2023/007010 (May 16, 2023).
(Continued)

*Primary Examiner* — William Hernandez
(74) *Attorney, Agent, or Firm* — Merchant & Gould P.C.

(57) ABSTRACT

This qubit control circuit includes a first power supply line through which a first excitation current, which is a current having a predetermined frequency, is input, a second power supply line through which a second excitation current, which is a current having a predetermined waveform, is input, and an output signal generation circuit including an input signal line through which an input signal indicating a logic state is input, a magnetic coupling part, and a Josephson junction, in which the Josephson junction outputs an output signal in accordance with the frequency of the first excitation current and the waveform of the second excitation current input via the magnetic coupling part, and the logic state indicated by the input signal.

5 Claims, 7 Drawing Sheets

(56) References Cited

U.S. PATENT DOCUMENTS

| | | | | |
|---|---|---|---|---|
| 5,229,962 | A | 7/1993 | Yuh et al. | |
| 5,396,242 | A | 3/1995 | Lee | |
| 5,646,526 | A | 7/1997 | Takeda et al. | |
| 2018/0101786 | A1 * | 4/2018 | Boothby ................ | G06N 10/40 |
| 2025/0055457 | A1 * | 2/2025 | Whittaker .............. | G06N 10/40 |
| 2025/0183897 | A1 * | 6/2025 | Takeuchi ............... | G06N 10/00 |

FOREIGN PATENT DOCUMENTS

| | | | |
|---|---|---|---|
| JP | 60-089126 | A | 5/1985 |
| JP | S62-102174 | A | 5/1987 |
| JP | S62-102175 | A | 5/1987 |
| JP | S63-290979 | A | 11/1988 |
| JP | H05-198856 | A | 8/1993 |
| JP | 2000-174612 | A | 6/2000 |
| JP | 2010-511946 | A | 4/2010 |
| JP | 2019-521546 | A | 7/2019 |
| JP | 2021-518991 | A | 8/2021 |
| WO | 2008/067664 | A1 | 6/2008 |
| WO | 2017/192733 | A2 | 11/2017 |
| WO | 2020/005534 | A1 | 1/2020 |

OTHER PUBLICATIONS

Office Action issued in Japanese Patent Application No. 2024-504673, date of mailing: May 26, 2026, 11 pages with English translation.

* cited by examiner

QUBIT CONTROL CIRCUIT

TECHNICAL FIELD

The present invention relates to a qubit control circuit.

This application is a National Stage Application of PCT/JP2023/007010, filed on Feb. 27, 2023, which claims priority to Japanese Patent Application No. 2022-032905, filed Mar. 3, 2022, and which applications are incorporated herein by reference. To the extent appropriate, a claim of priority is made to each of the above disclosed applications.

BACKGROUND ART

Quantum computers are capable of simulating quantum systems consisting of a large number of electrons and are therefore expected to be applicable to material design and drug discovery. Qubits controlled in a quantum computer are made of superconducting elements and thus need to be controlled at low temperatures. Therefore, the configuration of a quantum computer includes a refrigerator for keeping the qubits at a low temperature and a device that operates at room temperature. The device that operates at room temperature outputs a control signal to the qubits via a cable.

In a quantum computer, a large number of cables are required to control a large number of qubits in a refrigerator. For example, 168 cables are required to control 72 qubits. However, since there is an upper limit to the number of cables required to control the qubits, it is extremely difficult to increase the number of qubits.

To realize a large-scale quantum computer, control circuits that operate at the low temperature side like the qubits are required. For example, a quantum computing system in which the number of communication lines is smaller than the number of devices to be controlled (Patent Document 1) is known. Also, a superconducting quantum processor including a superconducting digital/analog converter that uses a flux quantum parametron as a shift register (Patent Document 2) is known.

CITATION LIST

Patent Document

Patent Document 1

Published Japanese Translation No. 2010-511946 of the PCT International Publication Patent Document 2

Published Japanese Translation No. 2019-521546 of the PCT International Publication

SUMMARY OF INVENTION

Technical Problem

As described above, there is a demand for controlling a large number of qubits with a small number of cables. Therefore, there is a demand for a circuit which can serve as an element constituting a qubit control circuit that can control a large number of qubits with a small number of cables.

The present invention has been made in view of the above points and provides a circuit which serves as an element constituting a qubit control circuit that can control a large number of qubits with a small number of cables.

Solution to Problem

The present invention was made to solve the above problems, and one aspect of the present invention is a qubit control circuit including a first power supply line through which a first excitation current, which is a current having a predetermined frequency, is input, a second power supply line through which a second excitation current, which is a current having a predetermined waveform, is input, and an output signal generation circuit including an input signal line through which an input signal indicating a logic state is input, a magnetic coupling part, and a Josephson junction, in which the Josephson junction outputs an output signal in accordance with the frequency of the first excitation current and the waveform of the second excitation current input via the magnetic coupling part, and the logic state indicated by the input signal.

Further, according to one aspect of the present invention, in the qubit control circuit, the first excitation current input to the first power supply line may include a plurality of frequencies, and the output signal generation circuit and a resonant circuit may be provided for each of the plurality of frequencies, and the resonant circuit may include a coupling part that is coupled to the first power supply line, and a second magnetic coupling part that is magnetically coupled to the magnetic coupling part of the output signal generation circuit, may have a resonance frequency that is one of the plurality of frequencies included in the first excitation current, and may supply the resonance frequency to the corresponding output signal generation circuit as the frequency of the first power supply line by causing a current of the resonance frequency to flow in the second magnetic coupling part.

Further, according to one aspect of the present invention, the qubit control circuit may further include a plurality of superconducting gate circuits including the output signal generation circuit and a third magnetic coupling part through which a current in accordance with the output signal flows, a fourth magnetic coupling part magnetically coupled to each of the third magnetic coupling parts of the plurality of superconducting gate circuits, and an output signal line configured to output an electromagnetic wave to be irradiated to a qubit in accordance with a magnetic flux applied to the fourth magnetic coupling portion by the output signal generated by each of the plurality of superconducting gate circuits.

Further, according to one aspect of the present invention, in the qubit control circuit, an amplitude and pulse width of the electromagnetic wave output from the output signal line may be controlled by an amplitude of the first excitation current. Further, according to one aspect of the present invention, in the qubit control circuit, the output signal generation circuit may include a configuration of a flux quantum parametron circuit.

Advantageous Effects of Invention

According to the present invention, it is possible to provide a circuit that is an element constituting a qubit control circuit that can control a large number of qubits with a small number of cables.

DESCRIPTION OF EMBODIMENTS

First Embodiment

Figure 1:
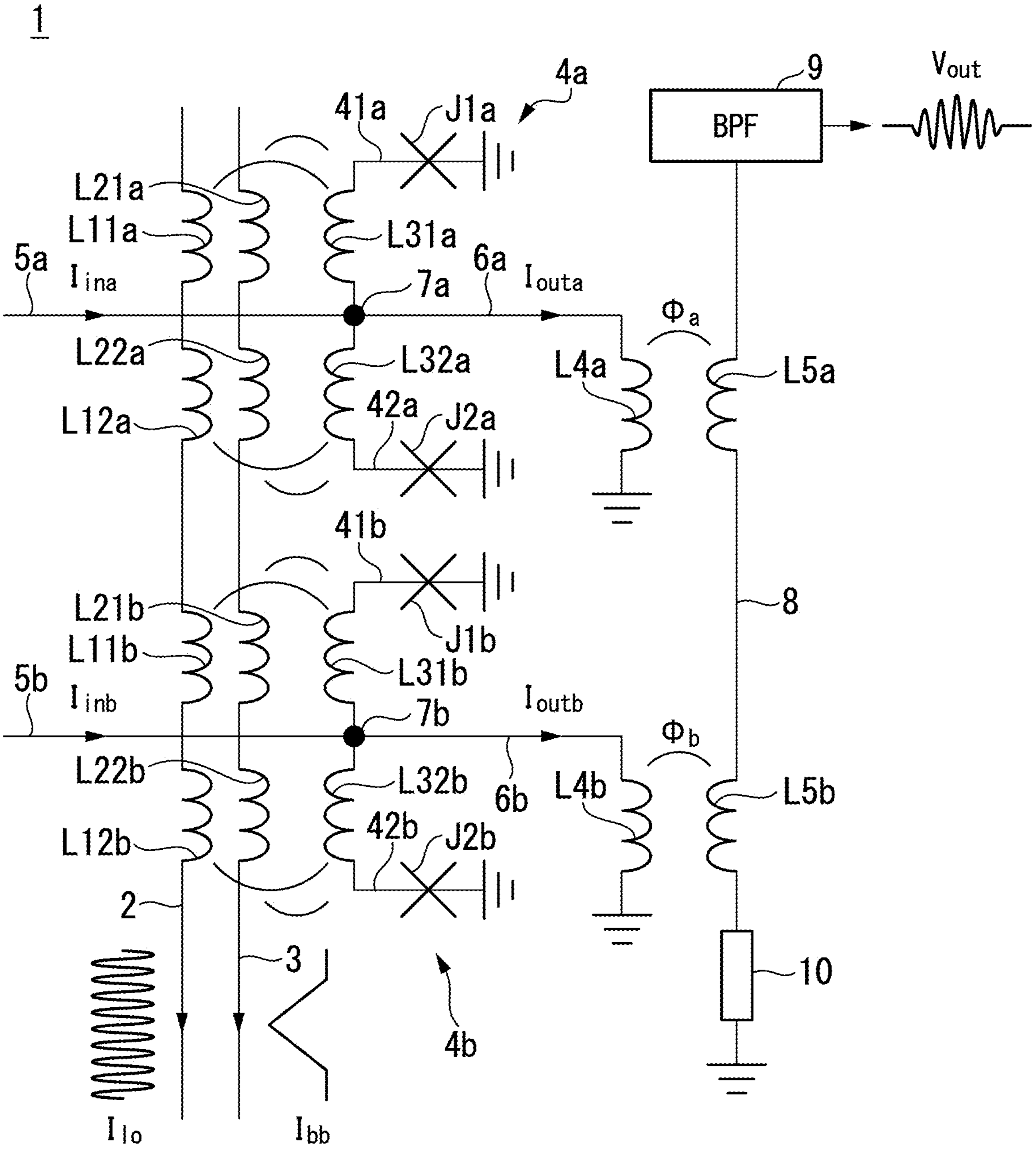
FIG. 1 is a diagram showing an example of a configuration of a qubit control circuit according to a first embodiment of the present invention.

An embodiment of the present invention will be described in detail below with reference to the drawings. FIG. 1 is a diagram showing an example of a configuration of a qubit control circuit 1 according to this embodiment. The qubit control circuit 1 is a circuit for irradiating a qubit to be controlled with microwaves. In the qubit control circuit 1, the microwaves are generated using a quantum flux parametron (QFP) circuit. As described later, the qubit control circuit 1 functions as a nonlinear mixer.

In the following description, when a current flows through one inductor to generate a magnetic flux, the magnetic flux also generates a magnetic flux in the other inductor, which may be referred to as the one inductor and the other inductor being magnetically coupled.

The qubit control circuit 1 includes a first power supply line 2, a second power supply line 3, a QFP gate 4*a*, a QFP gate 4*b*, an input signal line 5*a*, an input signal line 5*b*, an electromotive force output line 8, a band-pass filter 9, and a resistor 10.

Each of the QFP gate 4*a* and the QFP gate 4*b* is a QFP. A configuration of one QFP (the QFP gate 4*a*) includes a wiring 41*a*, an inductor L31*a*, a Josephson junction J1*a*, a wiring 42*a*, an inductor L32*a*, a Josephson junction J2*a*, a load inductor L4*a*, an input signal line 5*a*, and an output signal line 6*a*. Similarly, a configuration of one QFP (the QFP gate 4*b*) includes a wiring 41*b*, an inductor L31*b*, a Josephson junction J1*b*, a wiring 42*b*, an inductor L32*b*, a Josephson junction J2*b*, a load inductor L4*b*, an input signal line 5*b*, and an output signal line 6*b*.

In the configuration of the QFP gate 4*a*, a portion formed by the wiring 41*a*, the inductor L31*a*, the Josephson junction J1*a*, the wiring 42*a*, the inductor L32*a*, the Josephson junction J2*a*, and the input signal line 5*a* is also referred to as an output signal generation circuit 40*a*. Similarly, in the configuration of the QFP gate 4*b*, a portion formed by the wiring 41*b*, the inductor L31*b*, the Josephson junction J1*b*, the wiring 42*b*, the inductor L32*b*, the Josephson junction J2*b*, and the input signal line 5*b* is also referred to as an output signal generation circuit 40*b*.

The first power supply line 2 is a power supply line through which a first excitation current Ilo is input. The first excitation current Ilo is a current including a predetermined frequency. The frequency of the first excitation current Ilo is, for example, 5 GHZ. The first excitation current Ilo is a local oscillator signal supplied from a local oscillator (not shown). The local oscillator is provided separately from the qubit control circuit 1.

The first power supply line 2 includes an inductor L11*a*, an inductor L12*a*, an inductor L11*b*, and an inductor L12*b*.

The second power supply line 3 is a power supply line through which a second excitation current Ibb is input. The second excitation current Ibb is a current having a predetermined waveform. The second excitation current Ibb is a baseband signal supplied as an output signal from a baseband circuit (not shown). The baseband circuit is provided separately from the qubit control circuit 1. The waveform of the second excitation current Ibb is, for example, a triangular wave.

The second power supply line 3 includes an inductor L21*a*, an inductor L22*a*, an inductor L21*b*, and an inductor L22*b*.

The input signal line 5*a* is a control line through which an input current Iina is input, and the input signal line 5*b* is a control line through which an input current Iinb is input. The input current Iina and the input current Iinb are currents that determine logic states of the QFP gate 4*a* and the QFP gate 4*b*, respectively.

The QFP gate 4*a* generates an output current Iouta in accordance with the input current Iina, and the QFP gate 4*b* generates an output current Ioutb in accordance with the input current Iinb.

Now, with reference to FIG. 8, the operating principle of the QFP will be described in comparison with the QFP shown in FIG. 1.

Figure 8:
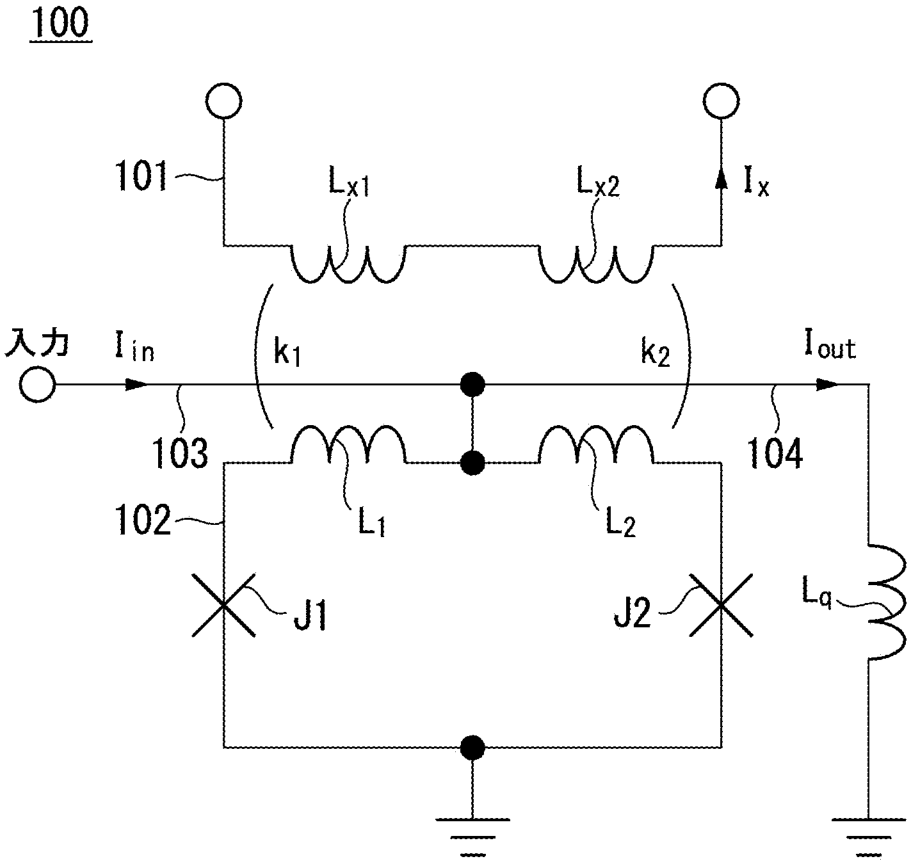
FIG. 8 is a diagram for explaining an operating principle of a flux quantum parametron.

FIG. 8 is a diagram for describing the operation principle of the QFP. The QFP 100 shows a basic gate of the QFP. The QFP 100 is driven and clocked by an AC excitation current Ix. When the AC excitation current Ix flows through the power supply line 101, a magnetic flux is generated in each of inductors Lx1 and Lx2 provided in the power supply line 101.

Although the qubit control circuit 1 (FIG. 1) includes two power supply lines (the first power supply line 2 and the second power supply line 3), in the QFP100 (FIG. 8), for ease of explanation, the power supply line corresponding to one of the first power supply line 2 and the second power supply line 3 is not illustrated, and it is assumed that the QFP100 has one power supply line (a power supply line 101). Here, as an example, the power supply line 101 will be described as corresponding to the first power supply line 2 in FIG. 1.

Moreover, the QFP 100 corresponds to either the QFP gate 4*a* or the QFP gate 4*b* shown in FIG. 1. Here, as an example, the QFP 100 will be described as corresponding to the QFP gate 4*a* in FIG. 1. In this example, the inductor Lx1 corresponds to the inductor L11*a* in FIG. 1, and the inductor Lx2 corresponds to the inductor L12*a* in FIG. 1. The AC excitation current Ix corresponds to the first excitation current Ilo in FIG. 1.

The inductor Lx1 and the inductor L1 provided in a loop 102 are magnetically coupled by a coupling constant k1. The inductor L1 corresponds to the inductor L31*a* in FIG. 1.

The inductor Lx2 and the inductor L2 provided in the loop 102 are magnetically coupled by a coupling constant k2. The inductor L2 corresponds to the inductor L32*a* in FIG. 1.

When a magnetic flux is applied to the inductors L1 and L2, a pair of Josephson junctions including a Josephson junction J1 and a Josephson junction J2 provided in the loop 102 determine a logic state according to an input current Iin flowing through an input signal line 103 and generate an output current Iout. The Josephson junction J1 corresponds to the Josephson junction J1*a* in FIG. 1, and the Josephson junction J2 corresponds to the Josephson junction J2*a* in FIG. 1. The input signal line 103 corresponds to the input signal line 5*a* in FIG. 1, and the input current Iin corresponds to the input current Iina in FIG. 1.

When the generated output current Iout flows through the output signal line 104, a magnetic flux is generated in a load inductor Lq provided in the output signal line 104.

The output signal line 104 corresponds to the output signal line 6*a* in FIG. 1, the output current Iout corresponds to the output current Iouta in FIG. 1, and the load inductor Lq corresponds to the load inductor L4*a* in FIG. 1.

In the QFP 100, power consumption can be reduced by optimizing the parameters of the inductor L1, the inductor L2, the load inductor Lq, the Josephson junction J1, and the Josephson junction J2. The QFP is known to have no DC resistance and extremely low power consumption because it uses superconducting elements. The power consumption per gate in the QFP is about 10 pW. Moreover, the QFP can operate at high speed with a clock frequency of about 10 GHz. Furthermore, since the QFP has extremely low power consumption, it can be operated in the vicinity of the qubit. Values of the power consumption and the clock frequency of the QFP described above are merely examples, and these values may vary in accordance with the circuit parameters and the type of circuit.

In QFP, it is determined whether or not an output current is generated by the Josephson junction in accordance with various parameters of the circuit. The parameters include a magnitude of an inductance of the inductor and a critical current value of the Josephson junction. In the QFP100, the magnitude of the inductance of each of the inductor L1, the inductor L2, and the load inductor Lq, and the critical current value of each of the Josephson junction J1 and the Josephson junction J2 are adjusted so that the output current Iout is generated by the Josephson junction J1 and the Josephson junction J2.

For each of the QFP gate 4*a* and the QFP gate 4*b* shown in FIG. 1, various parameters for the circuit are adjusted so that an output current is generated by the Josephson junction.

Returning to FIG. 1, the description of the configuration of the qubit control circuit 1 will be continued. Since the configuration of the QFP gate 4*a* is the same as that of the QFP gate 4*b*, the configuration of the QFP gate 4*a* will be described below, and the description of the configuration of the QFP gate 4*b* will be omitted.

The wiring 41*a*, the wiring 42*a*, the output signal line 6*a*, and the above-described input signal line 5*a* are connected to one another at a connection portion 7*a*. The inductor L31*a* and the Josephson junction J1*a* are provided on the wiring 41*a*. In FIG. 1, as an example, the inductor L31*a* and the Josephson junction J1*a* are disposed on the wiring 41*a* in this order from the side closest to the connection portion 7*a*. The order in which the inductor L31*a* and the Josephson junction J1*a* are disposed on the wiring 41*a* is not limited thereto and may be arbitrary. Of both ends of the wiring 41*a*, the end that is not connected to the connection portion 7*a* is connected to the ground.

The inductor L32*a* and the Josephson junction J2*a* are provided on the wiring 42*a*. In FIG. 1, as an example, the inductor L32*a* and the Josephson junction J2*a* are disposed on the wiring 42*a* in this order from the side closest to the connection portion 7*a*. The order in which the inductor L32*a* and the Josephson junction J2*a* are disposed on the wiring 42*a* is not limited thereto and may be arbitrary. Of both ends of the wiring 42*a*, the end that is not connected to the connection portion 7*a* is connected to the ground.

The Josephson junction J1*a*, the Josephson junction J2*a*, the inductor L31*a*, and the inductor L32*a* constitute a superconducting quantum interference device having a pair of Josephson junctions in a superconducting ring. The superconducting ring is a circuit equivalent to the loop 102 shown in FIG. 8. As the superconducting quantum interference device, a superconducting quantum interference device having three or more Josephson junctions in the superconducting ring may be used.

The electromotive force output line 8 includes an inductor L5*a*, an inductor L5*b*, a band-pass filter 9, and a resistor 10. One end of the electromotive force output line 8 is connected to the ground. In the electromotive force output line 8, the resistor 10, the inductor L5*b*, the inductor L5*a*, and the band-pass filter 9 are disposed in this order from closest to the ground. The resistor 10 may be omitted from the configuration of the electromotive force output line 8.

When the first excitation current Ilo flows through the first power supply line 2, and the second excitation current Ibb flows through the second power supply line 3, a magnetic flux is generated in the inductor L31*a* due to magnetic coupling between the inductor L31*a* and the inductor L11*a* and between the inductor L31*a* and the inductor L21*a*. When the first excitation current Ilo flows through the first power supply line 2 and the second excitation current Ibb flows through the second power supply line 3, a magnetic flux is generated in the inductor L32*a* due to magnetic coupling between the inductor L32*a* and the inductor L12*a* and between the inductor L32*a* and the inductor L22*a*. When the magnetic flux is generated in the inductor L31*a* and the inductor L32*a*, the Josephson junction J1*a* and the Josephson junction J2*a* determine a logic state in accordance with the input current Iina flowing through the input signal line 5*a* and generate the output current Iouta.

When the generated output current Iouta flows through the output signal line 6*a*, a magnetic flux is generated in the load inductor L4*a* provided in the output signal line 6*a*. A magnetic flux Pa is generated in the inductor L5*a* due to magnetic coupling between the load inductor L4*a* and the inductor La.

As described above, when the first excitation current Ilo flows through the first power supply line 2 and the second excitation current Ibb flows through the second power supply line 3, the QFP gate 4*a* generates the output current Iouta through magnetic coupling in accordance with the input current Iina flowing through the input signal line 5*a*. Furthermore, the output current Iouta generates a magnetic flux Pa in the inductor L5*a*. Furthermore, as the first excitation current Ilo and the second excitation current Ibb change, the magnetic flux Da changes, and an induced electromotive force in accordance with the change in the first excitation current Ilo and the second excitation current Ibb is generated in the inductor L5*a*.

Similarly, when the first excitation current Ilo flows through the first power supply line 2 and the second excitation current Ibb flows through the second power supply line 3, the QFP gate 4*b* generates an output current Ioutb through magnetic coupling in accordance with the input current Iinb flowing through the input signal line 5*b*. Furthermore, the output current Ioutb generates a magnetic flux Øb in the inductor L5*b*. Furthermore, as the first excitation current Ilo and the second excitation current Ibb change, the magnetic flux Øb changes, and an induced electromotive force is generated in the inductor L5*b* in accordance with the change in the first excitation current Ilo and the second excitation current Ibb.

As an induced electromotive force is generated in each of the inductors L5*a* and L5*b*, a current having a frequency in accordance with a change in the induced electromotive force flows through the electromotive force output line 8, unnecessary frequencies are removed by the band-pass filter 9, and then an output microwave Vout is output from the electromotive force output line 8. This output microwave Vout is irradiated to the qubit to be controlled by the qubit control circuit 1.

Figure 2:
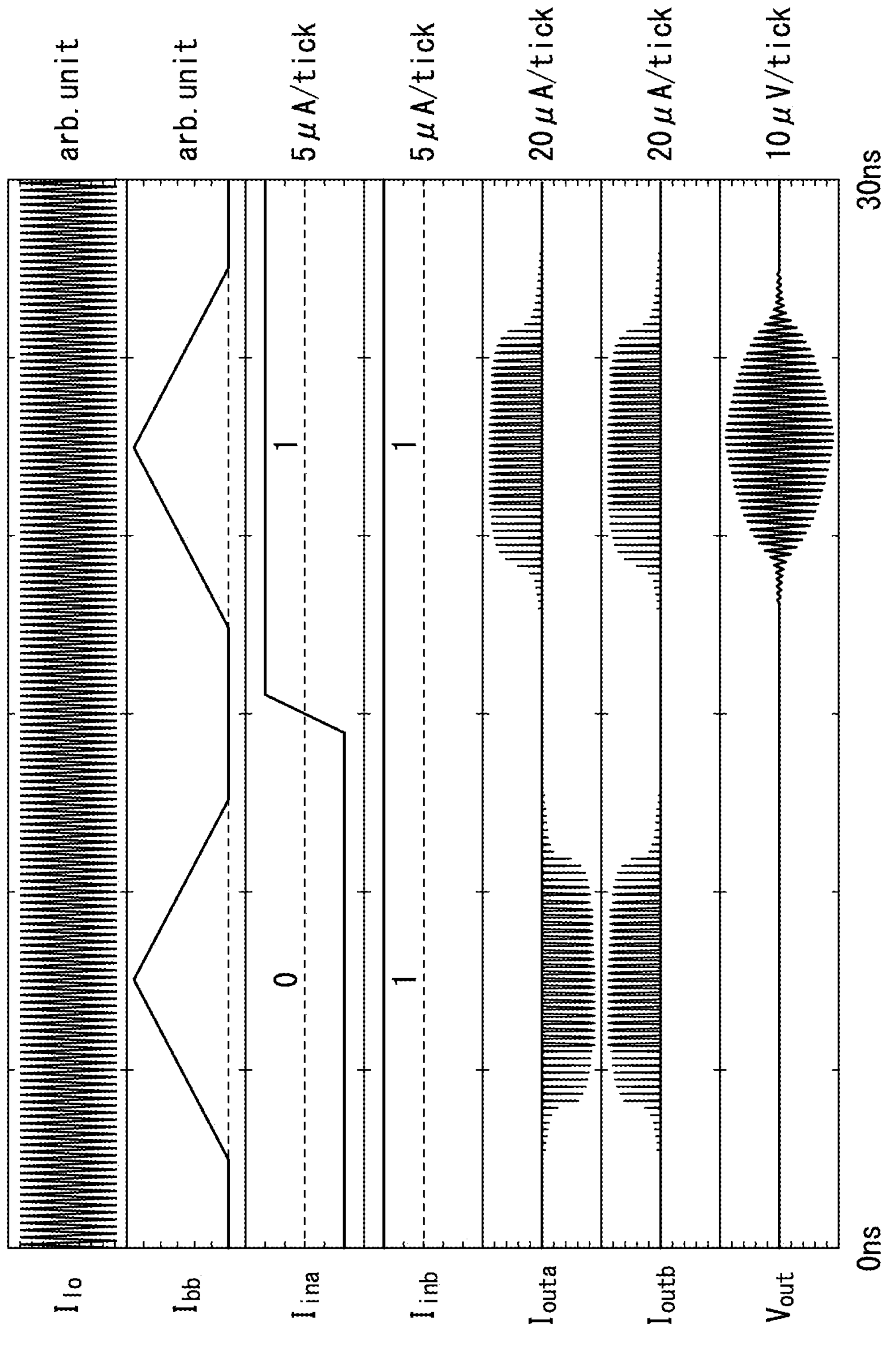
FIG. 2 is a diagram showing an example of a simulation result of the qubit control circuit according to the first embodiment of the present invention.

Now, with reference to FIG. 2, a simulation result using the qubit control circuit 1 will be described. FIG. 2 is a diagram showing an example of a simulation result using the qubit control circuit 1 according to this embodiment. In FIG. 2, a value of each physical quantity are shown for 30 nanoseconds.

The frequency of the first excitation current Ilo is 5 GHz as described above. The second excitation current Ibb is a triangular wave as described above. In FIG. 2, the values of the first excitation current Ilo and the second excitation current Ibb are each indicated in an arbitrary unit.

As an example, the input current Iina indicates logical states of "0, 1". In accordance with the logical states, a value of the input current Iina changes from low to high at around 15 nanoseconds. On the other hand, the input current Iinb indicates, as an example, logic states of "1, 1". In accordance with the logic states, the value of the input current Iinb is always high. In FIG. 2, a unit of each of the values of the input current Iina and the input current Iinb is 5 uA/tick.

The output current Iouta is generated on the basis of the first excitation current Ilo, the second excitation current Ibb, and the input current Iina. The output current Ioutb is generated on the basis of the first excitation current Ilo, the second excitation current Ibb, and the input current Iinb. Due to the magnetic flux applied by the first excitation current Ilo which is a local oscillator signal, both the output current Iouta and the output current Ioutb oscillate at 5 GHz which is the frequency of the first excitation current Ilo. Moreover, due to the magnetic flux applied by the second excitation current Ibb which is a baseband signal, both the output current Iouta and the output current Ioutb are output on the basis of the waveform of the second excitation current Ibb. The waveform of the second excitation current Ibb defines a timing at which the output current Iouta and the output current Ioutb are output. An amplitude and duty ratio of each of the output current Iouta and the output current Ioutb are determined by the waveform of the second excitation current Ibb.

A magnetic flux is applied to the QFP gate 4*a* from the two power supply lines including the first power supply line 2 and the second power supply line 3, respectively, and the QFP gate 4*a* is excited to generate the output current Iouta at the timing determined by the second excitation current Ibb. Since the output current Iouta is generated at the timing determined by the second excitation current Ibb, the amplitude and duty ratio of the output current Iouta gradually increase in accordance with rising of the second excitation current Ibb, and gradually decrease in accordance with falling of the second excitation current Ibb.

Similarly, a magnetic flux is applied to the QFP gate 4*b* from the two power supply lines including the first power supply line 2 and the second power supply line 3, respectively, and the QFP gate 4*b* is excited to generate the output current Ioutb at the timing determined by the second excitation current Ibb. Since the output current Ioutb is generated at the timing determined by the second excitation current Ibb, the amplitude and duty ratio of the output current Ioutb gradually increase in accordance with the rising of the second excitation current Ibb, and gradually decrease in accordance with the falling of the second excitation current Ibb.

Moreover, whether the output current Iouta oscillates in a range indicating a true logical value or in a range indicating a false logical value depends on the logical state indicated by the input current Iina. In other words, the logical value indicated by the output current Iouta is on the basis of the logical value indicated by the input current Iina. When the input current Iina indicates low, the output current Iouta oscillates in the range indicating the false logical value, and when the input current Iina indicates high, the output current Iouta oscillates in the range indicating the true logical value.

Similarly, whether the output current Ioutb oscillates in the range indicating the true logical value or in the range indicating the false logical value depends on the logical state indicated by the input current Iinb. In other words, the logical value indicated by the output current Ioutb is on the basis of the logical value indicated by the input current Iinb. In the example shown in FIG. 2, the input current Iinb is always high. Since the input current Iinb is always high, the logical value indicated by the output current Ioutb does not change with time and the output current Ioutb oscillates within the range indicating the true logical value.

In FIG. 2, the unit of each of the values of the output current Iouta and the output current Ioutb is 20 μA/tick.

The output microwave Vout is generated on the basis of the output current Iouta and the output current Ioutb. As described above, the logical value indicated by the output current Iouta is on the basis of the logical value indicated by the input current Iina, and the logical value indicated by the output current Ioutb is on the basis of the logical value indicated by the input current Iinb. The output microwave Vout is output when the logical value indicated by the input current Iina coincides with the logical value indicated by the input current Iinb. On the other hand, the output microwave Vout is not output when the logical value indicated by the input current Iina does not coincide with the logical value indicated by the input current Iinb. In particular, when the logical value indicated by the input current Iinb does not change over time as in the example shown in FIG. 2, whether or not the output microwave Vout is output is determined on the basis of the logical value indicated by the output current Iouta.

In a period from 0 nanoseconds to 15 nanoseconds, directions of oscillation between the output current Iouta and the output current Ioutb are opposite to each other, and phases thereof are aligned with each other, and the induced electromotive forces generated in the electromotive force output line 8 by both the output current Iouta and the output current Ioutb are combined, resulting in the amplitude of the output microwave Vout being zero.

In a period from 15 nanoseconds to 30 nanoseconds, the directions and phases of oscillation between the output current Iouta and the output current Ioutb are aligned with each other, and the induced electromotive forces generated in the electromotive force output line 8 by both the output current Iouta and the output current Ioutb are combined, resulting in a waveform of the output microwave Vout that oscillates at 5 GHz with the amplitude thereof gradually increasing and then gradually decreasing.

In FIG. 2, the unit of the value of the output microwave Vout is 10 uV/tick.

Here, the amplitudes of the output current Iouta, the output current Ioutb, and the output microwave Vout are compared in the period from 15 nanoseconds to 30 nanoseconds. The amplitudes of the output current Iouta and the output current Ioutb each tend to become saturated. On the other hand, the amplitude of the output microwave Vout tends to continue to increase even after the amplitudes of the output current Iouta and the output current Ioutb start to saturate. This is because the duty ratio of the output signals (the output current Iouta, and the output current Ioutb) generated by the QFP gates (the QFP gate 4*a*, and the QFP gate 4*b*) changes during one period.

The timing at which the output microwave Vout is output and (an envelope curve of) the waveform of the output microwave Vout are determined by the waveform of the second excitation current Ibb. The waveform of the output microwave Vout is a mixed waveform of the waveform of the first excitation current Ilo and the waveform of the second excitation current Ibb. Therefore, the qubit control circuit 1 functions as a mixer.

Moreover, it is possible to control whether the output microwave Vout is output or not by the logical value indicated by the input current Iina and the logical value indicated by the input current Iinb.

Now, with reference to FIGS. 3 and 4, a spectrum of the output microwave Vout as a result of the qubit control circuit 1 being applied with the first excitation current Ilo and the second excitation current Ibb will be described.

Figure 3:
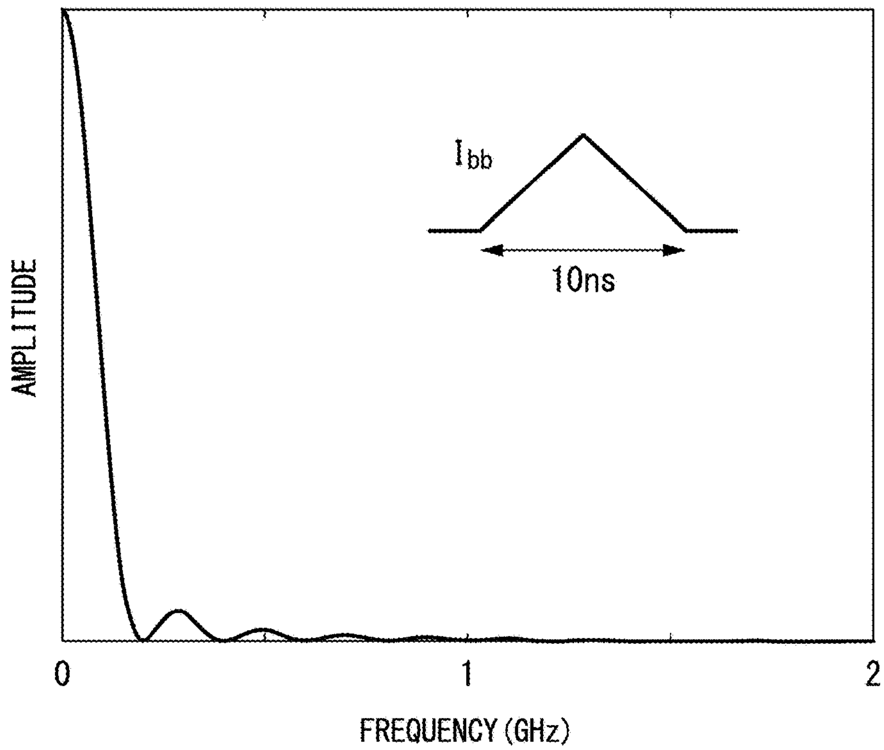
FIG. 3 is a diagram showing an example of a spectrum of a second excitation current which is a baseband signal according to the first embodiment of the present invention.

FIG. 3 is a diagram showing an example of the spectrum of the second excitation current Ibb which is a baseband signal according to this embodiment. FIG. 4 is a diagram showing an example of the spectrum of the output microwave Vout according to this embodiment. FIGS. 3 and 4 each show an amplitude value with respect to a signal frequency.

Figure 4:
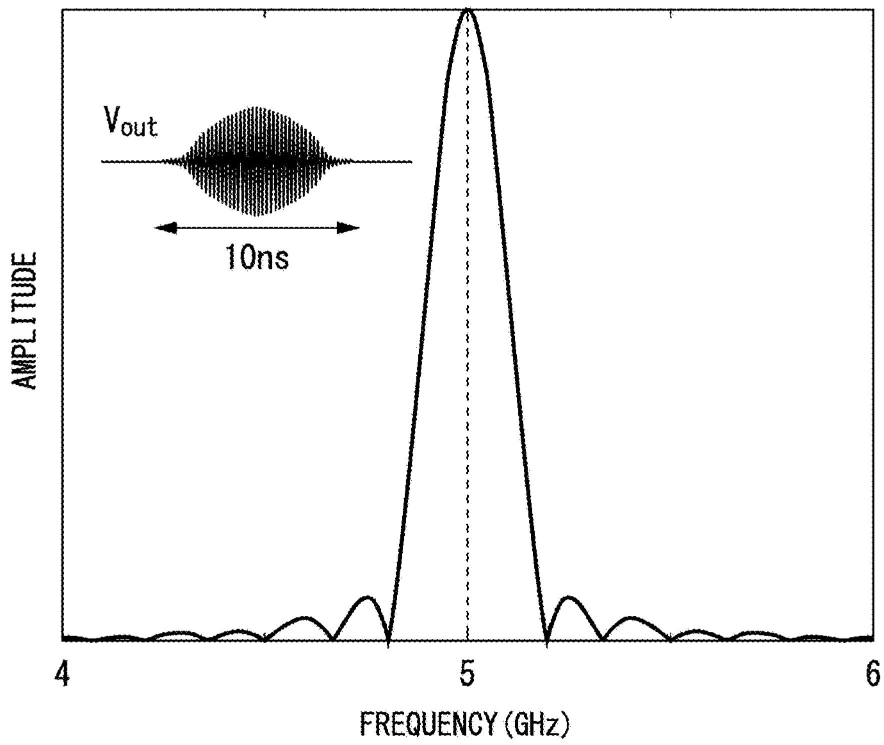
FIG. 4 is a diagram showing an example of a spectrum of an output microwave according to the first embodiment of the present invention.

The maximum value of the spectrum of the baseband signal shown in FIG. 3 is at 0 GHz, whereas the maximum value of the spectrum of the output microwave Vout shown in FIG. 4 is at 5 GHz. That is, it can be understood that the qubit control circuit 1 has up-converted the second excitation current Ibb, which is a baseband signal, by the first excitation current Ilo which is a local oscillator signal oscillating at 5 GHz.

In the qubit control circuit 1, since there is a nonlinear relationship between the second excitation current Ibb and the output signals (the output current Iouta, and the output current Ioutb) of the QFP, the qubit control circuit 1 functions as a nonlinear mixer. Furthermore, in the qubit control circuit 1, the waveform of the output microwave Vout can be controlled on the basis of the nonlinear relationship between the second excitation current Ibb and the output microwave Vout.

In this embodiment, the example in which the qubit control circuit 1 includes two QFP gates, the QFP gate 4*a* and the QFP gate 4*b* has been described, but the present invention is not limited thereto. The qubit control circuit may include only one QFP gate. That is, the qubit control circuit may include the first power supply line 2, the second power supply line 3, and a QFP gate (for example, the QFP gate 4*a*). Furthermore, the qubit control circuit may include three or more QFP gates. That is, the qubit control circuit may include the first power supply line 2, the second power supply line 3, and three or more QFP gates.

As described above, the first excitation current Ilo which is a current having a predetermined frequency is input to the first power supply line 2. The second excitation current Ibb which is a current having a predetermined waveform is input to the second power supply line 3.

The output signal generation circuit 40*a* includes an input signal line (for example, the input signal line 5*a*) through which an input signal (for example, the input current Iina) indicating a logic state is input, a magnetic coupling part (for example, the inductor L31*a*, and the inductor L32*a*), and a Josephson junction (for example, Josephson junction J1*a*, and the Josephson junction J2*a*). The Josephson junction (for example, the Josephson junction J1*a* and the Josephson junction J2*a*) outputs an output signal (for example, the output current Iouta) in accordance with the frequency of the first excitation current Ilo and the waveform of the second excitation current Ibb input via the magnetic coupling part (for example, the inductor L31*a*, and the inductor L32*a*) and the logical state indicated by an input signal (for example, the input current Iina).

In this embodiment, the example in which the qubit control circuit includes two power supply lines including the first power supply line 2 and the second power supply line 3 has been described, but the present invention is not limited thereto. The qubit control circuit may include a single power supply line that serves as both the first power supply line 2 and the second power supply line 3. When the qubit control circuit includes a single power supply line that serves as both the first power supply line 2 and the second power supply line 3, both the first excitation current Ilo and the second excitation current Ibb are input to the single power supply line.

In the qubit control circuit including the first power supply line 2, the second power supply line 3, and the output signal generation circuit 40*a*, the circuit for obtaining an output in accordance with the waveform of the first excitation current Ilo and the waveform of the second excitation current Ibb is configured by a combination of a magnetic coupling part and a Josephson junction, and thus a circuit configuration that curbs heat generation can be realized. Since the qubit control circuit described above has the circuit configuration that curbs heat generation, it can be disposed inside a refrigerator.

The qubit control circuit including the first power supply line 2, the second power supply line 3, and the output signal generation circuit 40*a* can be used as a component circuit constituting a qubit control circuit capable of controlling a large number of qubits with a small number of cables. A specific example of the qubit control circuit capable of controlling a large number of qubits with a small number of cables will be described in a second embodiment.

As described above, the qubit control circuit 1 according to this embodiment includes a plurality of superconducting gate circuits (in this embodiment, the QFP gate 4*a* and the QFP gate 4*b*), fourth magnetic coupling parts (in this embodiment, the inductor L5*a* and the inductor L5*b*), and an output signal line (in this embodiment, the electromotive force output line 8).

Each of the plurality of superconducting gate circuits (in this embodiment, the QFP gate 4*a* and the QFP gate 4*b*) includes an output signal generation circuit (in this embodiment, the output signal generation circuit 40*a* and the output signal generation circuit 40*b*), and a third magnetic coupling part (in this embodiment, the load inductor L4*a* and the load inductor LAb) through which a current in accordance with an output signal (in this embodiment, the output current Iouta and the output current Ioutb) flows.

The fourth magnetic coupling parts (in this embodiment, the inductor L5*a* and the inductor L5*b*) are magnetically coupled to the third magnetic coupling parts (in this embodiment, the load inductor L4*a* and the load inductor LAb) of the plurality of superconducting gate circuits.

The output signal line (in this embodiment, the electromotive force output line 8) outputs an electromagnetic wave (in this embodiment, the output microwave Vout) to be irradiated to the qubit in accordance with the magnetic flux applied to the fourth magnetic coupling parts (in this embodiment, the inductor L5*a* and the inductor L5*b*) by the output signals (in this embodiment, the output current Iouta and the output current Ioutb) generated by the plurality of superconducting gate circuits (in this embodiment, the QFP gate 4*a* and the QFP gate 4*b*).

With such a configuration, the qubit control circuit 1 according to this embodiment has a circuit configuration that curbs heat generation, and thus can be placed inside a refrigerator. The qubit control circuit 1 can be used as a circuit that is a component constituting a qubit control circuit capable of controlling a large number of qubits with a small number of cables.

A specific example of the qubit control circuit capable of controlling a large number of qubits with a small number of cables will be described in a second embodiment.

Second Embodiment

Hereinafter, the second embodiment of the present invention will be described in detail with reference to the drawings.

In the above first embodiment, the case in which the local oscillator signal on the first power supply line contains a single frequency have been described. In this embodiment, a case in which a plurality of frequencies are included in the local oscillator signal and output microwaves on the basis of each of the frequencies are output will be described.

The qubit control circuit according to this embodiment is referred to as a qubit control circuit 1A.

Figure 5:
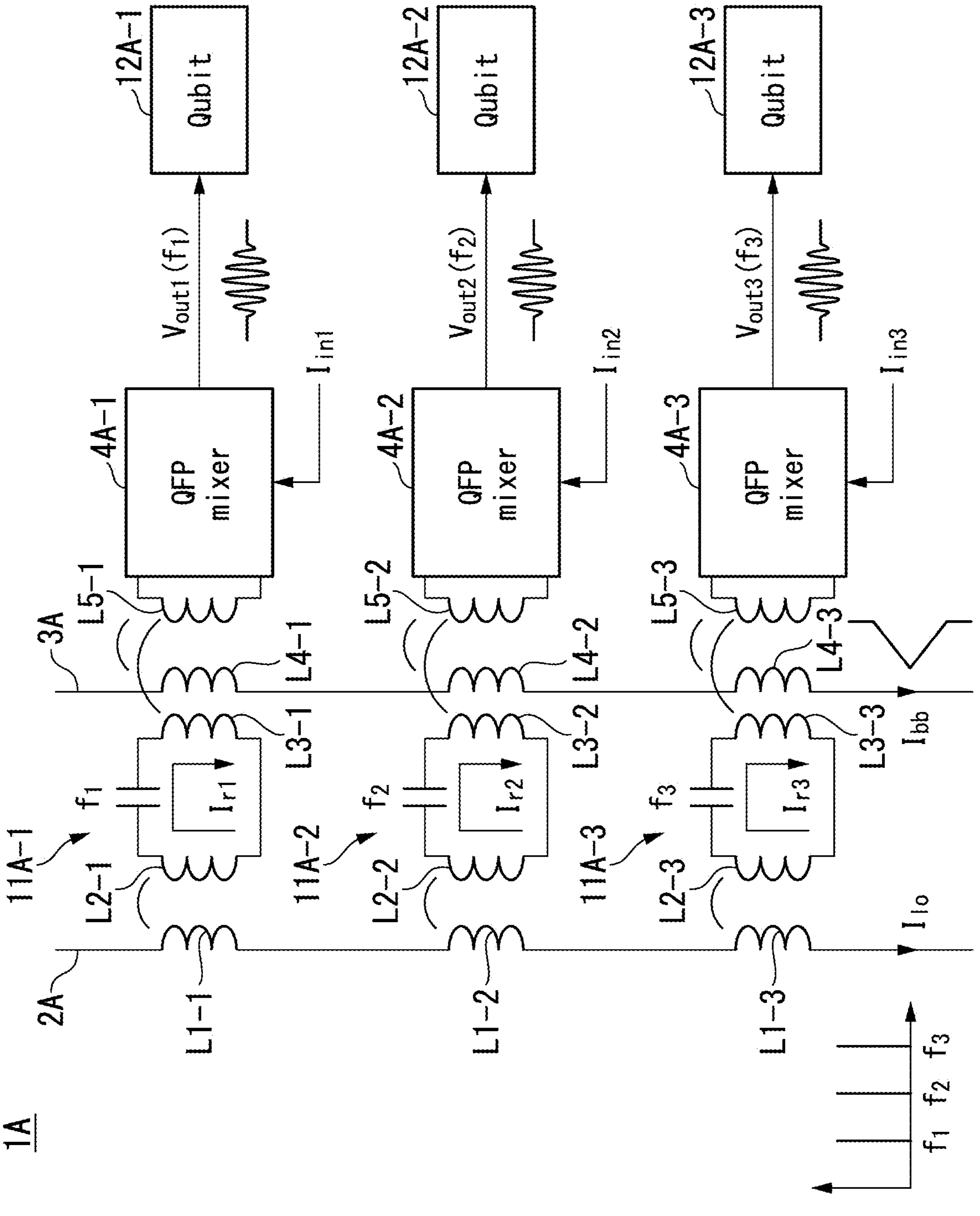
FIG. 5 is a diagram showing an example of a configuration of a qubit control circuit according to a second embodiment of the present invention.

FIG. 5 is a diagram showing an example of a configuration of the qubit control circuit 1A according to this embodiment. The qubit control circuit 1A includes a first power supply line 2A, a second power supply line 3A, a resonant circuit 11A (a resonant circuit 11A-1, a resonant circuit 11A-2, a resonant circuit 11A-3), and a QFP mixer 4A (a QFP mixer 4A-1, a QFP mixer 4A-2, and a QFP mixer 4A-3). The qubit control circuit 1A includes the QFP mixer 4A and the resonant circuit 11A for each of a plurality of frequencies.

The first power supply line 2A is a power supply line through which a first excitation current Ilo is input. The first excitation current Ilo is a current including a plurality of frequencies. In other words, a plurality of frequencies are multiplexed and included in the first excitation current Ilo.

The plurality of frequencies included in the first excitation current Ilo are frequencies corresponding to a qubit 12A-1, a qubit 12A-2, and a qubit 12A-3 that are targets of control of the qubit control circuit 1A. In this embodiment, as an example, the first excitation current Ilo includes three frequencies including a frequency f1, a frequency f2, and a frequency f3.

The first power supply line 2A includes an inductor L1-1, an inductor L1-2, and an inductor L1-3.

The second power supply line 3A is a power supply line through which a second excitation current Ibb is input. The second excitation current Ibb is a current having a predetermined waveform. The second excitation current Ibb is a baseband signal supplied as an output signal from a baseband circuit. The waveform of the second excitation current Ibb flowing through the second power supply line 3A is, for example, a triangular wave, similar to the waveform of the second excitation current Ibb flowing through the second power supply line 3 shown in FIG. 1.

The second power supply line 3A includes an inductor L4-1, an inductor L4-2, and an inductor L4-3.

Each of the resonant circuit 11A-1, the resonant circuit 11A-2, and the resonant circuit 11A-3 extracts a specific frequency from the plurality of frequencies included in the first excitation current Ilo by resonance. The resonant circuit 11A-1, the resonant circuit 11A-2, and the resonant circuit 11A-3 have the same functions except that they have different resonance frequencies. Therefore, in the following, only the resonant circuit 11A-1 will be described, and descriptions of the resonant circuit 11A-2 and the resonant circuit 11A-3 will be omitted.

The resonant circuit 11A-1 is a circuit that resonates at a predetermined frequency (a resonance frequency). The resonance frequency is equal to any one of the plurality of frequencies included in the first excitation current Ilo. The resonant circuit 11A-1 is, for example, an LC circuit. The resonant circuit 11A-1 includes an inductor L2-1 and an inductor L3-1. The inductor L2-1 is magnetically coupled to the inductor L1-1 provided in the first power supply line 2A. The inductor L3-1 is magnetically coupled to an inductor L5-1 provided in the QFP mixer 4A-1.

The QFP mixer 4A (the QFP mixer 4A-1, the QFP mixer 4A-2, and the QFP mixer 4A-3) is a QFP circuit for mixing a first excitation current Ilo as a local oscillator signal and a second excitation current Ibb as a baseband signal. The QFP mixer 4A-1, the QFP mixer 4A-2, and the QFP mixer 4A-3 have the same functions except that the frequencies included in the first excitation current Ilo that are mixed with the second excitation current Ibb are different from each other. Therefore, in the following, only the QFP mixer 4A-1 will be described, and descriptions of the QFP mixer 4A-2 and the QFP mixer 4A-3 will be omitted.

The QFP mixer 4A-1 is a mixer having a configuration which is the same as that of the qubit control circuit 1 shown in FIG. 1. In FIG. 5, the magnetic coupling between the QFP mixer 4A-1 and other circuit devices is abstractly shown by an inductor L5-1.

In the resonant circuit 11A-1, when the first excitation current Ilo flows through the first power supply line 2A, a current having a frequency at which the resonant circuit itself resonates, among the plurality of frequencies included in the first excitation current Ilo, flows due to magnetic coupling between the inductor L2-1 and the inductor L1-1. Therefore, the resonant circuit 11A-1 extracts a frequency equal to its own resonance frequency from among the plurality of frequencies included in the first excitation current Ilo flowing through the first power supply line 2A.

In this embodiment, the example in which the resonant circuit 11A-1 and the first power supply line 2A are coupled by magnetic coupling via the inductor L2-1 and the inductor L1-1 will be described, but the present invention is not limited thereto. The coupling between the resonant circuit 11A-1 and the first power supply line 2A may be capacitive coupling via a capacitor.

In the following description, the current of the resonance frequency flowing through the resonant circuit 11A-1 is referred to as a component excitation current Ir1.

The QFP mixer 4A-1 outputs an output signal in accordance with the input current Iin1 that is a current input to an input signal line (not shown) due to the magnetic coupling between the inductor L5-1 and the inductor L3-1 included in the resonant circuit 11A-1 and the magnetic coupling between the inductor L5-1 and the inductor L4-1 provided in the second power supply line 3A when the component excitation current Ir1 flows through the resonant circuit 11A-1 and the second excitation current Ibb flows through the second power supply line 3A.

In FIG. 5, the magnetic coupling between the second power supply line 3A and the QFP mixer 4A-1 is shown as being represented by the inductor L5-1 and the inductor L4-1, and the magnetic coupling between the resonant circuit 11A-1 and the QFP mixer 4A-1 is shown as being represented by the inductor L5-1 and the inductor L3-1. In FIG. 5, the configuration corresponding to the inductors L31*a*, L32*a*, L31*b*, and L32*b* shown in FIG. 1 is abstractly shown by the inductor L5-1.

In this embodiment, an output signal output by the QFP mixer 4A-1 is an output microwave Vout1 which is a microwave. A frequency of the output microwave Vout1 is the same as the frequency f1 extracted by the resonant circuit 11A-1 from the frequency-multiplexed first excitation current Ilo. That is, the QFP mixer 4A-1 outputs, as the output signal, a microwave having a frequency f1 extracted from the first excitation current Ilo by the resonant circuit 11A-1.

The input current Iin1 is supplied from a circuit provided separately from the qubit control circuit 1A.

In the qubit control circuit 1 shown in FIG. 1, two input signals (the input current Iina and the input current Iinb) are input, whereas in the QFP mixer 4A-1 shown in FIG. 5, only one input signal (the input current Iin1) is shown. Two input signals are also input to the QFP mixer 4A-1 shown in FIG. 5, similarly to the qubit control circuit 1 shown in FIG. 1. The input current Iin indicates one of the two input signals. In the other one of the two input signals, the logic state is fixed to "1" or "0". Similarly, for each of the QFP mixer 4A-2 and the QFP mixer 4A-3, only one of the two input signals (an input current Iin2 and an input current Iin3) is shown.

An output microwave Vout1 having a frequency f1 output by the QFP mixer 4A-1 is irradiated onto a qubit 12A-1. Similarly, an output microwave Vout2 having a frequency f2 output by the QFP mixer 4A-2 is irradiated onto a qubit 12A-2. Similarly, an output microwave Vout3 having a frequency f3 output by the QFP mixer 4A-3 is irradiated onto a qubit 12A-3.

In the qubit control circuit 1A, on and off states of the output microwave Vout1, the output microwave Vout2, and the output microwave Vout3 are controlled by the logic states indicated by the input current Iin1, the input current Iin2, and the input current Iin3, respectively.

In the qubit control circuit 1A, the amplitude of the output microwave Vout1, the output microwave Vout2, or the output microwave Vout3 can be controlled by adjusting an amplitude of each frequency component included in the first excitation current Ilo. That is, in the qubit control circuit 1A, the amplitude of the output microwave can be controlled by a spectrum of the first excitation current Ilo.

Figure 6:
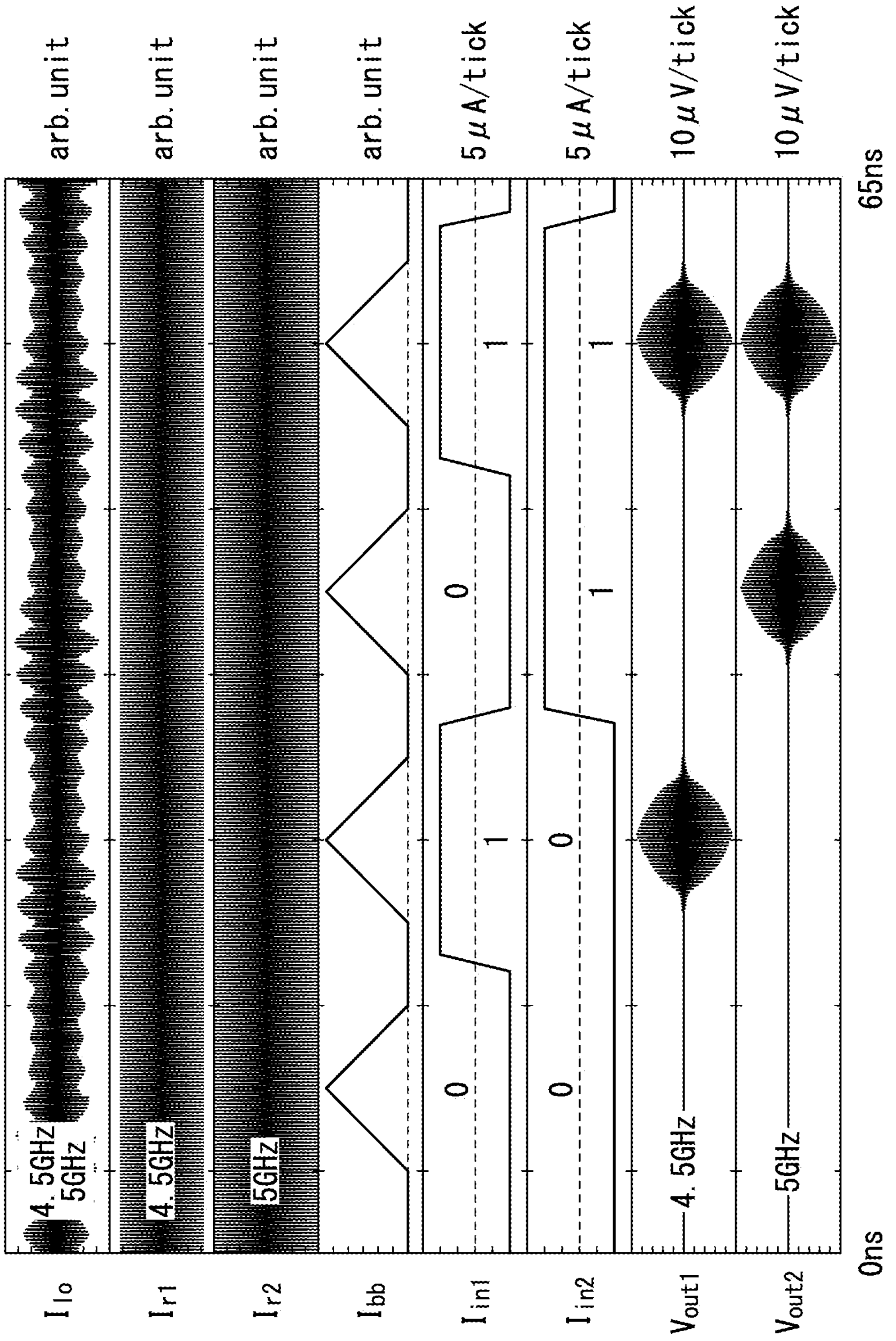
FIG. 6 is a diagram showing an example of a simulation result of the qubit control circuit according to the second embodiment of the present invention.

Next, a simulation result by the qubit control circuit 1A will be described with reference to FIG. 6. FIG. 6 is a diagram showing an example of a simulation result by the qubit control circuit 1A according to this embodiment. The simulation result shown in FIG. 6 is for a case in which the first excitation current Ilo includes two frequencies. In FIG. 6, values of each physical quantity are shown for 65 nanoseconds.

The first excitation current Ilo includes two frequencies of 4.5 GHz and 5 GHz. The frequency of the component excitation current Ir1 that flows through the resonant circuit 11A-1 due to resonance is 4.5 GHz. The frequency of the component excitation current Ir2 that flows through the resonant circuit 11A-2 due to resonance is 5 GHz. The second excitation current Ibb has a triangular wave. In FIG. 6, the values of the first excitation current Ilo, the component excitation current Ir1, the component excitation current Ir2, and the second excitation current Ibb are each expressed in an arbitrary unit.

The input current Iin1 input to the QFP mixer 4A-1 indicates, as an example, logic states of "0, 1, 0, 1". The input current Iin2 input to the QFP mixer 4A-2 indicates, as an example, logic states of "0, 0, 1, 1". In FIG. 6, the unit of each of the values of the input current Iin1 and the input current Iin2 is 5 pA/tick.

The output microwave Vout1 is generated on the basis of the frequency of 4.5 GHz included in the first excitation current Ilo, the second excitation current Ibb, and the input current Iin1. By mixing the frequency of 4.5 GHz included in the first excitation current Ilo, which is a local oscillator signal, with the second excitation current Ibb, which is a baseband signal, the output microwave Vout1 oscillates at 4.5 GHz with an amplitude in accordance with the logic state indicated by the input current Iin1. The output microwave Vout1 has an amplitude of almost zero and does not oscillate during a period in which the logical state indicated by the input current Iin1 is "0," and the output microwave Vout1 oscillates at 4.5 GHz with the waveform of the second excitation current Ibb being nonlinearly reflected during a period in which the logical state is "1."

As described above, one of the two input signals input to the QFP mixer 4A-1 is an input current Iin1, and the other has a fixed logical value. FIG. 6 shows the simulation result when the logic value of the other input signal is "1". Since the logic state of the other input signal is fixed to "1," the output microwave Vout1 is output with a predetermined amplitude when the logic value of the input current Iin1 is "1," and the amplitude of the output microwave Vout1 is nearly zero and is not output when the logic value of the input current Iin1 is "0". The same applies to the relationship between the input current Iin2 and the output microwave Vout2.

The output microwave Vout2 is generated on the basis of the frequency of 5 GHz included in the first excitation current Ilo, the second excitation current Ibb, and the input current Iin2. By mixing the frequency of 5 GHz included in the first excitation current Ilo, which is a local oscillator signal, with the second excitation current Ibb, which is a baseband signal, the output microwave Vout2 oscillates at 5 GHz with an amplitude in accordance with the logic state indicated by the input current Iin2. The output microwave Vout2 has an amplitude of almost zero and does not oscillate during a period in which the logical state indicated by the input current Iin2 is "0," and the output microwave Vout2 oscillates at 5 GHz with the waveform of the second excitation current Ibb being nonlinearly reflected during a period in which the logical state is "1."

In FIG. 6, the unit of each value of the microwave output Vout1 and the microwave output Vout2 is 10 μV/tick.

Figure 7:
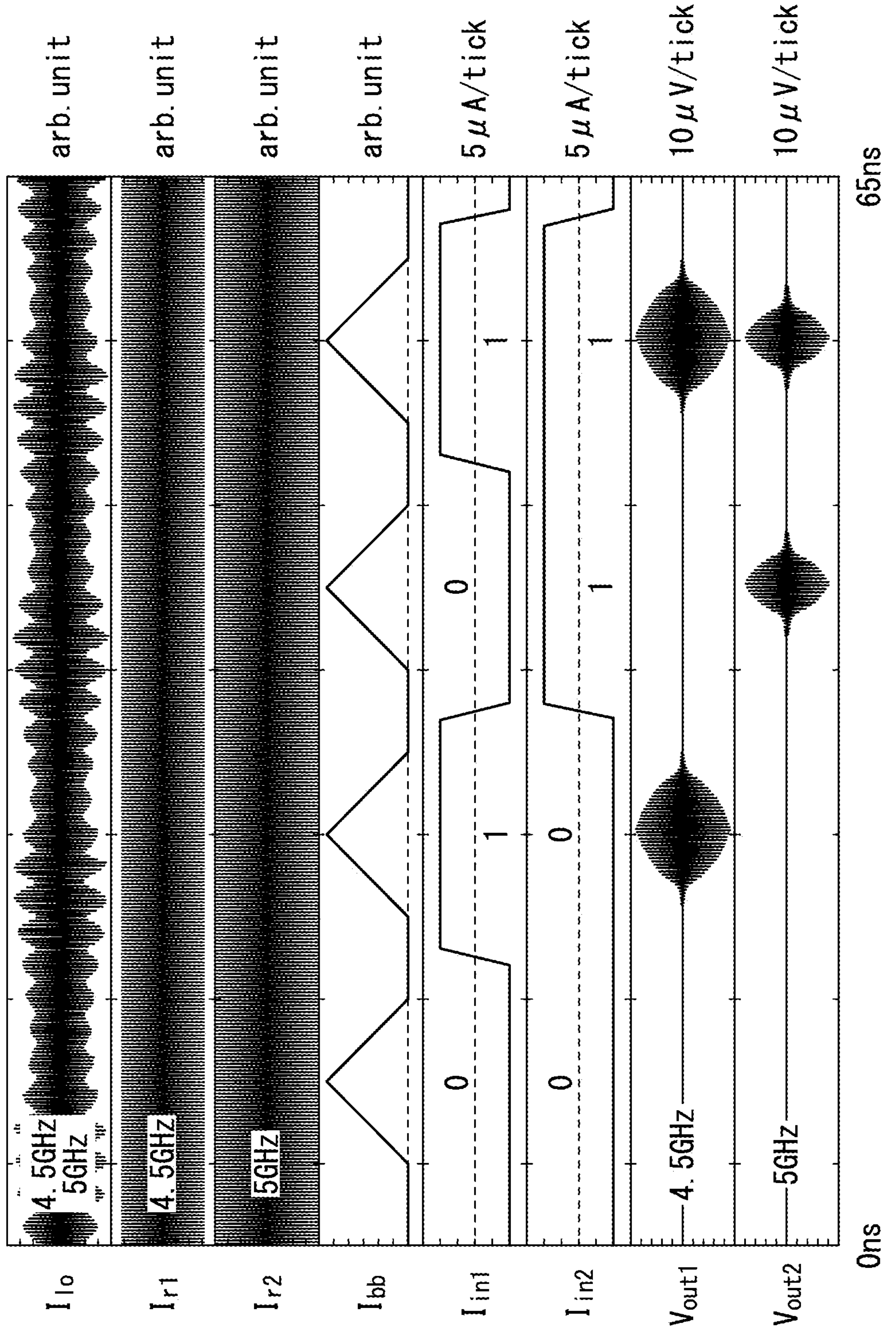
FIG. 7 is a diagram showing an example of the relationship between the spectrum of the first excitation current and an amplitude of an output microwave according to the second embodiment of the present invention.

As described above, the amplitude of the output microwave can be controlled by the spectrum of the first excitation current Ilo. Here, with reference to FIG. 7, the control of the amplitude of the output microwave by the spectrum of the first excitation current Ilo will be described. FIG. 7 is a diagram showing an example of the relationship between the spectrum of the first excitation current Ilo and the amplitude of the output microwave according to this embodiment.

The amplitude of the frequency component of 5 GHz is reduced in the first excitation current Ilo shown in FIG. 7 compared to the first excitation current Ilo shown in FIG. 6.

The power of the frequency component of 5 GHz is −55.7 dBm for the first excitation current Ilo shown in FIG. 6, whereas it is −58.7 dBm for the first excitation current Ilo shown in FIG. 7. The amplitude of the frequency component of 4.5 GHz is −56.6 dBm for both the first excitation current Ilo shown in FIG. 6 and the first excitation current Ilo shown in FIG. 7.

In accordance with the reduction in the amplitude of the frequency component of 5 GHz included in the first excitation current Ilo, the output microwave Vout2 has a reduced amplitude and a reduced pulse width. Since the amplitude of the frequency component of 4.5 GHz included in the first excitation current Ilo is not changed, neither the amplitude nor pulse width of the output microwave Vout1 is changed.

Therefore, the amplitude and pulse width of the electromagnetic waves (in this embodiment, the output microwave Vout1, the output microwave Vout2, and the output microwave Vout3) outputted from the output signal line (in this embodiment, not shown and corresponding to the electromotive force output line 8 in FIG. 1) are controlled by the amplitude of a predetermined frequency component in the first excitation current Ilo. Even in a case in which only one component corresponding to the QFP mixer 4A is provided, as in the qubit control circuit 1 (FIG. 1) according to the first embodiment described above, the amplitude and pulse width of the output microwave Vout can be adjusted by changing the amplitude of the first excitation current Ilo.

As described above, in the qubit control circuit 1A according to this embodiment, the first excitation current Ilo input to the first power supply line 2A includes a plurality frequencies (in this embodiment, frequencies of the frequency f1, the frequency f2, and the frequency f3), and an output signal generation circuit (in this embodiment, not shown and corresponding to the output signal generation circuit 40*a* in the configuration of the QFP gate 4*a* in FIG. 1 and the output signal generation circuit 40*b* in the configuration of the QFP gate 4*b*) and a resonant circuit are provided for each of a plurality of frequencies (in this embodiment, frequencies of the frequency f1, the frequency f2, and the frequency f3).

The resonant circuit (in this embodiment, the resonant circuit 11A-1, the resonant circuit 11A-2, the resonant circuit 11A-3) includes a coupling part (in this embodiment, the inductor L2-1, the inductor L2-2, and the inductor L2-3) that is coupled to the first power supply line 2A, and a second magnetic coupling part (in this embodiment, the inductor L3-1, the inductor L3-2, and the inductor L3-3) magnetically coupled to a magnetic coupling part (in this embodiment, the inductor L5-1, the inductor L5-2, and the inductor L5-3) of an output signal generation circuit (in this embodiment, not shown and corresponding to the output signal generation circuit 40*a* in the configuration of the QFP gate 4*a* and the output signal generation circuit 40*b* in the configuration of the QFP gate 4*b* in FIG. 1), has a resonance frequency that is one of a plurality of frequencies (in this embodiment, the frequencies of the frequency f1, the frequency f2, and the frequency f3) included in the first excitation current Ilo, and supplies the resonance frequency to a corresponding output signal generation circuit (in this embodiment, not shown and corresponding to the output signal generation circuit 40*a* in the configuration of the QFP gate 4*a* and the output signal generation circuit 40*b* in the configuration of the QFP gate 4*b* in FIG. 1) as the frequency of the first power supply line 2A by passing a current having the resonance frequency through a second magnetic coupling part (in this embodiment, the inductor L3-1, the inductor L3-2, and the inductor L3-3).

With this configuration, in the qubit control circuit 1A according to this embodiment, regardless of the number of qubits, the number of cables required to control the qubits is two including the first power supply line 2A and the second power supply line 3A, and thus a large number of qubits can be controlled with a small number of cables. Here, a small number of cables means that the number is smaller than the number of qubits to be controlled.

In this embodiment, the example in which the first excitation current Ilo includes three frequencies has been described, but the present invention is not limited thereto. The first excitation current Ilo may include one, two, or four or more frequencies in accordance with the number of qubits to be controlled. The qubit control circuit includes at least pairs of resonant circuits and output signal generation circuits, the number of which is equal to or greater than the number of frequencies included in the first excitation current Ilo. Some pairs of the resonant circuit and the output signal generation circuit included in the qubit control circuit may be unused. Also, a plurality of pairs of the resonant circuit and the output signal generation circuit may correspond to a certain frequency included in the first excitation current Ilo.

In this embodiment, the example in which the resonant circuit and the power supply line (the first power supply line) are coupled by magnetic coupling has been described, but the present invention is not limited thereto. The resonant circuit and the power supply line may be coupled by capacitive coupling.

In each of the above-described embodiments, the QFP provided in the qubit control circuit may be an adiabatic QFP (AQFP) or a directly coupled QFP (DQFP).

In each of the above-described embodiments, the example in which the electromagnetic wave generated by the qubit control circuits 1 and 1A and irradiated to the control target (the qubit) is a microwave has been described, but the present invention is not limited thereto. The frequency of the electromagnetic wave generated by the qubit control circuits 1 and 1A and irradiated to the control target (the qubit) may be other than the frequency of the microwave. In other words, the qubit control circuits 1 and 1A may generate electromagnetic waves having a frequency other than the frequency of the microwave and may irradiate the control target.

In each of the above-described embodiments, the example in which the control target of the qubit control circuit is a qubit has been described, but the present invention is not limited thereto. A control target other than the qubit may be controlled by a circuit having a configuration that is the same as that of the qubit control circuit according to each of the above-described embodiments. The control target other than qubit includes, for example, various components that constitute circuits of a quantum computer.

Although one embodiment of the present invention has been described in detail above with reference to the drawings, the specific configuration is not limited to the above, and various design changes and the like are possible within the scope that does not deviate from the gist of the present invention.

REFERENCE SIGNS LIST

1, 1A Qubit control circuit
2, 2A First power supply line
3, 3A Second power supply line
40*a*, 40*b* Output signal generation circuit
Ilo First excitation current
Ibb Second excitation current

11A Resonant circuit
5*a*, 5*b* Input signal line
4*a*, 4*b* QFP gate
4A QFP mixer
Lina, Iinb, Iin2, Iin3 Input current

The invention claimed is:

1. A qubit control circuit comprising:

a first power supply line through which a first excitation current, which is a current having a predetermined frequency, is input;

a second power supply line through which a second excitation current, which is a current having a predetermined waveform, is input; and an output signal generation circuit including an input signal line through which an input signal indicating a logic state is input, a magnetic coupling part, and a Josephson junction, in which the Josephson junction outputs an output signal in accordance with the frequency of the first excitation current and the waveform of the second excitation current input via the magnetic coupling part, and the logic state indicated by the input signal.

2. The qubit control circuit according to claim 1, wherein the first excitation current input to the first power supply line includes a plurality of frequencies, the output signal generation circuit and a resonant circuit are provided for each of the plurality of frequencies, and the resonant circuit includes a coupling part that is coupled to the first power supply line, and a second magnetic coupling part that is magnetically coupled to the magnetic coupling part of the output signal generation circuit, has a resonance frequency that is one of the plurality of frequencies included in the first excitation current, and supplies the resonance frequency to the corresponding output signal generation circuit as the frequency of the first power supply line by causing a current of the resonance frequency to flow in the second magnetic coupling part.

3. The qubit control circuit according to claim 1, further comprising a plurality of superconducting gate circuits including the output signal generation circuit and a third magnetic coupling part through which a current in accordance with the output signal flows, a fourth magnetic coupling part magnetically coupled to each of the third magnetic coupling parts of the plurality of superconducting gate circuits, and an output signal line configured to output an electromagnetic wave to be irradiated to a qubit in accordance with a magnetic flux applied to the fourth magnetic coupling part by the output signal generated by each of the plurality of superconducting gate circuits.

4. The qubit control circuit according to claim 3, wherein an amplitude and pulse width of the electromagnetic wave output from the output signal line are controlled by an amplitude of the first excitation current.

5. The qubit control circuit according to claim 1, wherein the output signal generation circuit includes a configuration of a flux quantum parametron circuit.

* * * * *